(12) United States Patent
Feld et al.

(10) Patent No.: US 6,281,755 B1
(45) Date of Patent: Aug. 28, 2001

(54) HIGH-FREQUENCY POWER AMPLIFIER

(75) Inventors: Peter Feld, Nuremberg; Horst Kroeckel, Bamberg; Markus Vester, Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/221,049

(22) Filed: Dec. 28, 1998

(51) Int. Cl.[7] .................................................. H03F 3/191
(52) U.S. Cl. ............................ 330/302; 330/126; 330/297
(58) Field of Search .................................... 330/302, 306, 330/165, 297, 126

(56) References Cited

U.S. PATENT DOCUMENTS

| | | | |
|---|---|---|---|
| 5,008,631 | * 4/1991 | Scherer et al. | 330/51 |
| 5,438,684 | * 8/1995 | Schwent et al. | 330/124 R |
| 5,546,051 | * 8/1996 | Koizumi et al. | 330/297 |
| 5,673,003 | * 9/1997 | Zocher | 330/306 |
| 5,774,017 | * 6/1998 | Adar | 330/126 |
| 5,784,692 | * 6/1998 | Kleinberg | 330/300 |
| 5,960,334 | * 9/1999 | Nakano | 330/302 |
| 5,973,557 | * 10/1999 | Miyaji et al. | 330/51 |
| 6,028,486 | * 2/2000 | Andre | 330/297 |

* cited by examiner

Primary Examiner—Benny Lee
Assistant Examiner—Khanh Van Nguyen
(74) Attorney, Agent, or Firm—Schiff Hardin & Waite

(57) ABSTRACT

A high-frequency power amplifier for feeding an antenna of a nuclear magnetic resonance tomography apparatus has at least one amplifier stage that can emit a maximum output power within a first frequency band. Circuitry for frequency-dependently altering the maximum output power is connected to the amplifier stage, whereby the maximum output power within a second frequency band, that is higher than the first frequency band is higher than within the first frequency band.

9 Claims, 5 Drawing Sheets

HIGH-FREQUENCY POWER AMPLIFIER

BACKGROUND OF THE INVENTION

1. Field of the Invention

The present invention is directed to a high-frequency power amplifier for feeding an antenna of a nuclear resonance tomography apparatus of the type having at least one amplifier stage that can emit a maximum output power within given frequency band.

2. Description of the Prior Art

The Larmor frequency $f_0$, i.e. the frequency of a nuclear magnetic resonance signal, is proportional to the magnetic field strength at the location of the nuclei. The proportionality factor is the gyromagnetic constant y. This is utilized in nuclear magnetic resonance tomography systems. The Larmor frequency $f_0$ therein is basically defined by the basic magnetic field, which, for example, amounts to 0.5 Tesla, 1 Tesla or even 1.5 Tesla. The corresponding frequencies of the nuclear magnetic resonance signal thereby lie on the order of magnitude of 20, 40 or, respectively, 63 MHZ.

For exciting the nuclear spins in a patient disposed in the basic magnetic field is also subject to a radio-frequency field generated by an antenna, whereby the frequency is likewise defined by the gyromagnetic constant $\gamma$ and the magnetic field strength at the corresponding location in the patient.

A high-frequency power amplifier feeding the antenna must adhere to the boundary conditions explained below. A high-frequency magnetic field strength $B_1$ that is predetermined independently of the basic magnetic field strength by the relationship $B_1 = \alpha/(360 \cdot t_p \cdot \gamma)$ is required for the excitation of the nuclear spins with a flip angle $\alpha$. The pulse duration $t_p$ can be set by the measuring sequence. Although the high-frequency magnetic field strength is independent of the frequency, the peak transmission power to be supplied by the high-frequency power amplifier increases with the frequency determined by the basic magnetic field. The reason for this is that eddy current losses in the patient increase approximately quadratically with the frequency. In addition, the losses in the antenna increase somewhat with the square root of the frequency. The high-frequency transmission amplifier must have a power output which compensates for (overcomes) these losses in order to generate the desired high-frequency magnetic field strength in the patient, or to effect the desired excitation of the nuclear spins. Different peak transmission powers thus exist for the high-frequency transmission amplifier at different basic magnetic field strengths. Typical values of the peak power are, for example, 10 kW given a frequency of 40.5 MHZ (corresponding to a basic magnetic field strength Bo of 0.95 T) and 15 kW given a frequency of 63.6 MHZ (corresponding to a basic magnetic field strength $B_0$ of 1.5 T).

Another important dimensioning quantity for the high-frequency power amplifier is the average power that can be applied to the patient, averaged over the pulse repetition time $t_R$. Independent of the frequency $f_0$, it is limited by the maximally allowed tissue heating in the patient. A value of 600 W is typical for the average power given an allowable, specific power density of 4 W/kg, a patient weight up to 100 kg and 33% antenna losses. This means that an allowable pulse-duty factor of the high-frequency pulses is lower at higher frequencies than at lower frequencies. For example, the pulse-duty factor amounts to 6% at 40.5 MHZ and 4% at 63.6 MHZ.

A high-frequency power amplifier employable at a number of magnetic resonance frequencies, i.e. in nuclear magnetic resonance tomography apparatus with differing basic magnetic field strength, should thus be able to supply a peak power that increases with the frequency. The average power thereby remains constant. Class B linear amplifiers are usually employed in high-frequency power amplifiers. Their efficiency is optimum when they are operated at full modulation. Only a part of the feed DC voltage is utilized given lower modulation. The direct current and power use of the amplifier thereby drops linearly, but the high-frequency power that is emitted drops with the square of the modulation. The efficiency is then correspondingly reduced by the relationship of peak power to maximum peak power.

When a narrowband amplifier (i.e. the bandwidth is very small compared to the center frequency) has to cover only a single frequency band, then the high-frequency load resistor is selected (or if adjustable, is set) to a value at the output of the last amplifier stage so that full modulation is reached at the maximum peak power. A fixed high-frequency matching network between the amplifier stage that is formed by power transistors or power tubes and the actual amplifier output generally serves this purpose. Differently dimensioned matching networks are required when the narrowband amplifier is to be utilized for a number of frequency bands.

On the other hand, an approximately constant and real load resistor over a frequency range up to several octaves can be achieved given transistor amplifiers with known matching circuits. Such broadband amplifiers do not require differently dimensioned matching networks for the frequency bands lying within these octaves. Given employment in a nuclear magnetic resonance tomography apparatus, the transformation of the high-frequency load must be designed according to the maximum peak load demanded at the highest frequency. The non-optimum efficiency at the lower frequency band must be compensated via corresponding power reserves of the amplifier stage. When, for example, the broadband amplifier is designed for 40 MHZ and 63 MHZ, then the d.c. input power from the supply of such a broadband amplifier is greater by a factor 1.22 for an output power of 10 kW required at 40 MHZ than given optimum design only for 40 MHZ. The theoretical dissipated power is then even greater by the factor 2, which requires double the cooling outlay.

In order to optimize the required input power and the dissipated power to be eliminated, it is desirable that the maximum peak power be exactly equal to the peak power required at the respective operating frequency band. The average values of the input power and of the dissipated power are then frequency-independently defined only by the average output power. The energy consumption required for the operation and the outlay for the power supply and cooling when then be lowest.

SUMMARY OF THE INVENTION

An object of the present invention is to provide a high-frequency power amplifier for feeding an antenna of a nuclear magnetic resonance tomography apparatus that can be utilized at a number of frequencies and which has a minimal outlay for the power supply and cooling.

This object is achieved in a power amplifier having a circuit which alters the maximum output power dependent on frequency connected to the amplifier stage, the power amplifier being operable to emit peak power within a first frequency band and a second frequency band. The maximum output power within the second frequency band, which is higher than the first frequency band, is higher than within the first frequency band. Leaving the saturation residual voltage out of consideration, a maximum peak power $P_{pmax} = U_{dc}^2 \cdot G_L/^2$ can be delivered given full modulation of the amplifier stage. $U_{dc}$ thereby denotes an operating DC voltage at the amplifier stage and $G_L$ denotes a high-frequency load guideline value transformed at the output of the amplifier stage. As a result of this relationship, either the operating DC voltage or the transformed load guideline value can be varied for variation of the maximum peak power.

In an embodiment, the amplifier stage is connected to a variable operating DC voltage source, whereby an operating DC voltage delivered by the operating DC voltage source is higher given operation within the higher frequency band than given operation within the lower frequency band. The relationship of the operating DC voltages is basically defined by the nuclear magnetic resonant frequency prescribed by the basic magnetic field strength. The switching can ensue electronically, whereby the power supply allocated to the high-frequency power amplifier must receive and interpret information about the intended operating frequency.

In another embodiment the amplifier stage is followed by a matching network that transforms an antenna impedance at the higher frequency band into a lower high-frequency load impedance for the amplifier stage than at the lower frequency band. The reactances employed in the matching network can, for example, be switchable, so that the optimum high-frequency load resistance can be set in the respective operating frequency band. Again, the information about the intended operating frequency must be communicated to the amplifier, for example, via interfaces and software protocol.

It is especially advantageous to design the matching network itself such that it has the required frequency dependency without switching the high-frequency load guideline value that is presented to the preceding amplifier stage. It should be noted, however, that a frequency-dependent real part of an admittance is also always linked to a non-zero imaginary part due to system-theoretical reasons (causality), so that the intended frequency dependency can fundamentally not be exactly realized over a large, continuous frequency range. For single, narrow frequency bands, however, the required frequency dependency of the load guideline value can be set. This is done in the power amplifier described herein. It is adequate to adhere to the required frequency dependency of the load guideline value within a few relatively narrow frequency bands. The center frequencies are determined by the basic magnetic field strengths. A gap between these frequency bands is not required. Simplifying the dimensioning is the recognition that a blind part of up to 25% of the active part (load factor cos φ=0.97) can be tolerated without noteworthy losses of efficiency.

The above demands can be met by a corresponding dimensioning of matching structures that are known in term of circuitry.

In another embodiment, the matching network is a bandpass filter of the second order with a parallel resonant circuit connected in parallel at the input side and a series resonant circuit connected in series at the output side. The bandpass filter of the second order is especially advantageous given the matchings to be realized in the nuclear magnetic resonance tomography apparatus.

According to a further embodiment, the matching circuit includes a magnetically coupled transformer. The magnetically coupled transformer inserted into the circuit allows the antenna impedance, transformed to a reference impedance $Z_0$, for example, $Z_0=50 \Omega$, to be transformed to an arbitrary value matched to the output power and to the existing operating DC voltages without varying the relative frequency dependency. The high load guideline values needed given high-performance transistor amplifiers can thus also be brought into matchable range. Thus, a bandpass filter of the second order employed as the matching network, having a parallel resonant circuit connected in parallel at the input side and a series resonant circuit connected in series at the output side, can only increase the impedance of high-frequency load (antenna) connected to the output with reference to the input side. If the arrangement of the parallel resonant circuit and the series resonant were interchanged, the impedance could only be transformed toward lower values. This limitation is overcome by the transformer given a suitably selected turns ratio.

In a further embodiment a main inductance and a capacitance of the transformer forms at least a part of an inductance or a capacitance of the parallel resonant circuit. A stray inductance of the transformer forms at least a part of the series resonant circuit. The inherently present parasitic reactances of the intervening transformer can thus be taken into consideration in the dimensioning of the transformation elements.

According to another embodiment, thus, the transformer can be realized without ferromagnetic material. The stray inductance enlarged by the low degree of coupling forms a part of the series resonant circuit. This is especially important upon utilization in a nuclear magnetic resonance tomography apparatus because the matching network can then also be arranged in the stray region of the basic magnetic field without having to fear a saturation.

In another embodiment an output capacitance of the amplifier stage forms at least a part of the capacitance of the parallel resonant circuit. The inherently disturbing output capacitance of the amplifier stage thus can be utilized for realizing the capacitance value required for the matching. The selection of components for the amplifier stage is thus less critical.

DESCRIPTION OF THE PREFERRED EMBODIMENTS

Figure 1:
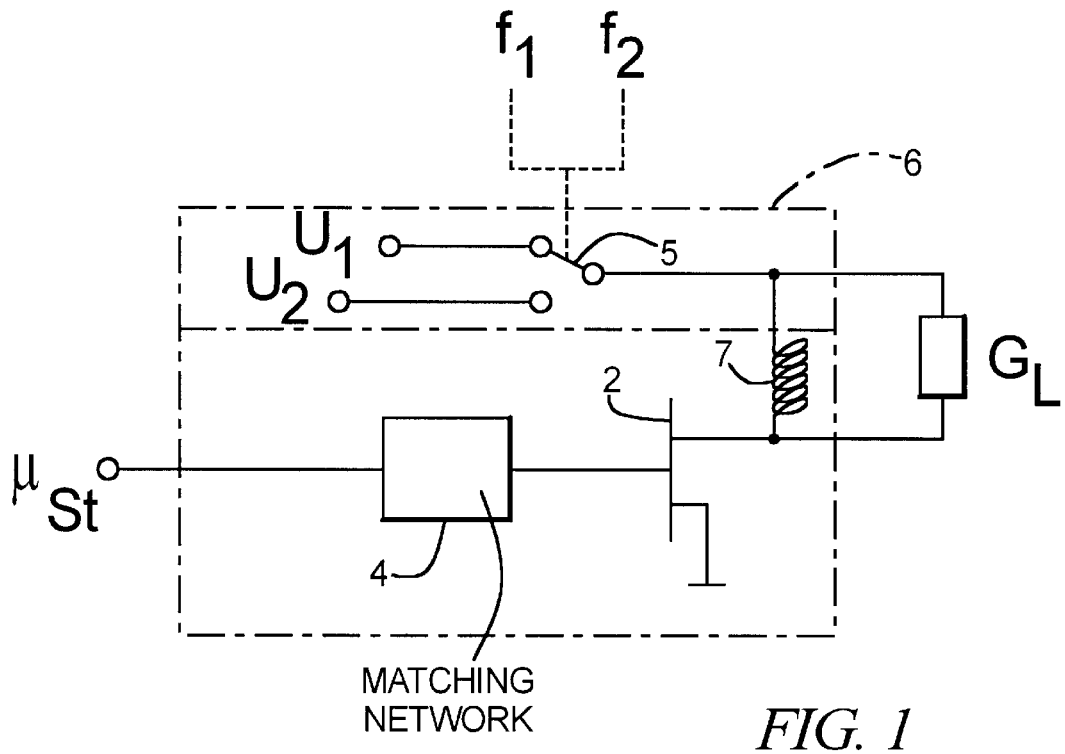
FIG. 1 is a block circuit diagram of a high-frequency amplifier with a switchable power supply in accordance with the invention.

FIG. 1 shows a block circuit diagram of a high-frequency power amplifier that operates within two operating frequency bands given full modulation in order to supply a maximum peak power. The two operating frequency bands are relatively narrow and are characterized by the two center frequencies $f_1$ or $f_2$. The higher frequency $f_2$ is higher by at least the factor 1.3 than the lower frequency $f_1$. The maximum peak power at the higher frequency $f_2$ is greater than at the lower frequency $f_1$. The power amplifier has an amplifier stage 2 that is symbolically shown by a transistor circuit symbol. The amplifier stage 2 can be composed of one or more transistors that are connected as class B linear amplifiers. The amplifier stage 2 has an input side preceded by an input matching network 4 in order to transform an input impedance of the amplifier stage to a reference value, for example, 50 Ω. A control signal $U_{St}$ is supplied for the drive of the amplifier.

Operating DC voltages $U_1$, $U_2$ are generated by a power supply 6 that, dependent on the operating frequency $f_1$ or $f_2$, is supplied to the amplifier stage 2 via a switch 5 and via an inductor 7. The first operating frequency band is characterized by a center frequency $f_1$ of approximately 40 MHZ and the second is characterized by a center frequency of $f_2$ of approximately 63 MHZ. At 40 MHZ, a peak power $P_{max1}$= 10 kW is demanded and a peak load $P_{pmax2}$=15 kW is demanded at 63.6 MHZ at a high-frequency load, indicated by a load guideline value $G_L$. Usually, the high-frequency load is matched to the output resistance of the amplifier stage 2 with a matching network 8, however, this is not shown here. The lowering of the maximum peak power at the lower operating frequency ensues by a corresponding decrease of the operating DC voltages for the amplifier stage 2. At 50 Ω, for example, an operating DC voltage $U_1$ of approximately 130 V then derives for the operation in the region of 40 MHZ and an operating DC voltage $U_2$ of approximately 160 V derives in the region of 63 MHZ. The information for the high-frequency power amplifier about operating frequency is interpreted in order to deliver the corresponding operating DC voltage $U_1$ or $U_2$ to the amplifier stage 2 via the switch 5.

Figure 2:
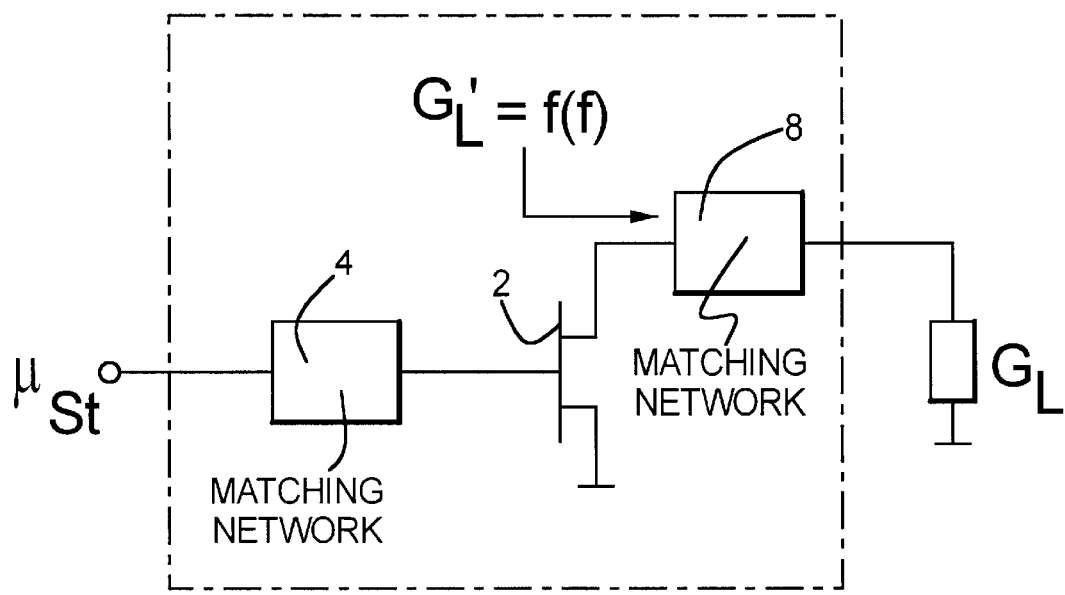
FIG. 2 is a block circuit diagram of a high-frequency amplifier with a frequency-dependent transformation of the high-frequency load in accordance with the invention.

FIG. 2 shows a high-frequency equivalent circuit diagram of the high-frequency power amplifier, wherein the maximum peak power is predetermined by the corresponding operating frequency band in the above-described way. The maximum peak power, however, is automatically defined by the operating frequency without switching elements. To that end, an output matching network 8 is connected to the output side of the amplifier stage 2, the high-frequency antenna then being connected to this output matching network 8. As a result of a correspondingly fashioned frequency characteristic of the output matching network 8, the load guidelines value $G_L$ established by the antenna is then transformed frequency-dependently such that the amplifier stage 2 sees a lower load guideline value $G_L'$ within the lower operating frequency band than at the higher. Since the maximum peak power $P_{max1}$ at 63 MHZ in the example amounts to approximately 1.5 times the maximum peak power $P_{pmax2}$ at 40 MHZ, the peak guidelines value $G_L'$ ($f_2$) at 63 MHZ must be increased correspondingly with the factor 1.5 compared to the load guideline value $G_L'$ ($f_1$) at 40 MHZ.

Figure 3:
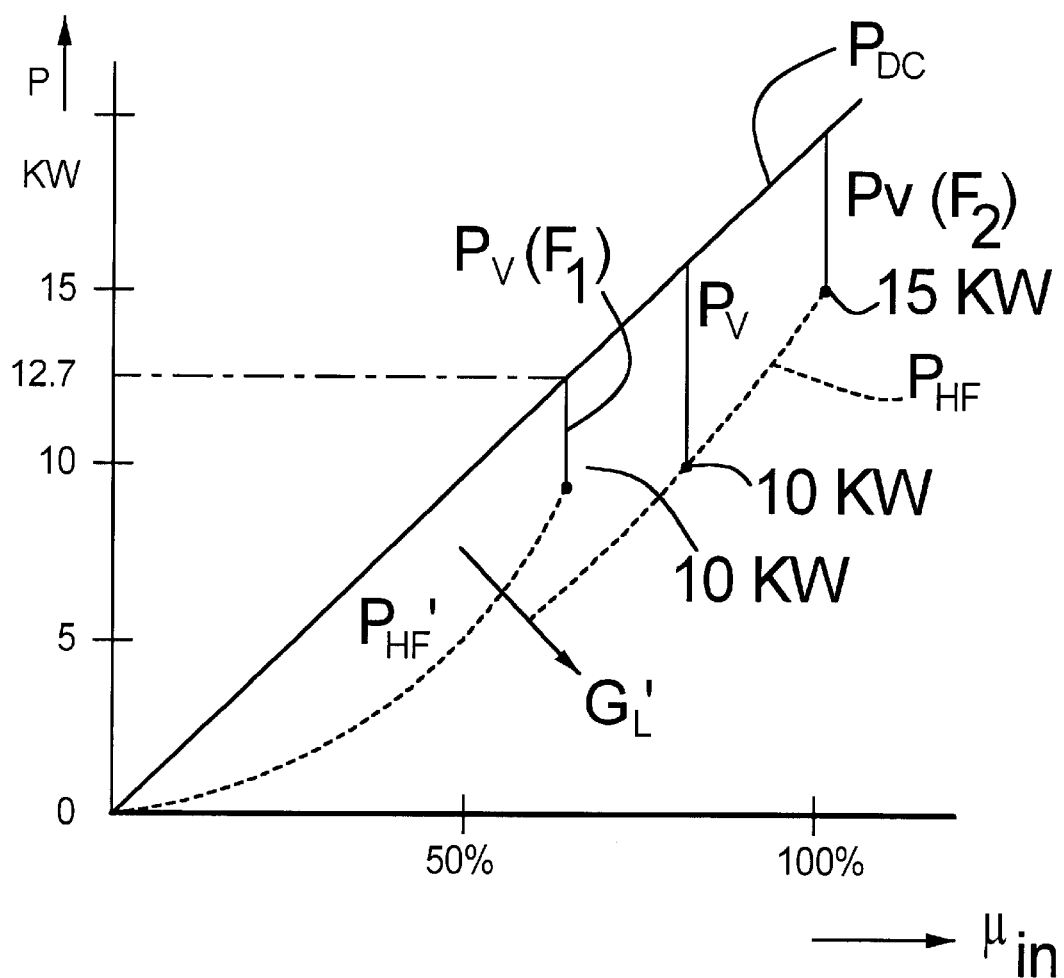
FIG. 3 is a diagram of the power relationships within the high-frequency power amplifier in accordance with the invention.
Figure 4:
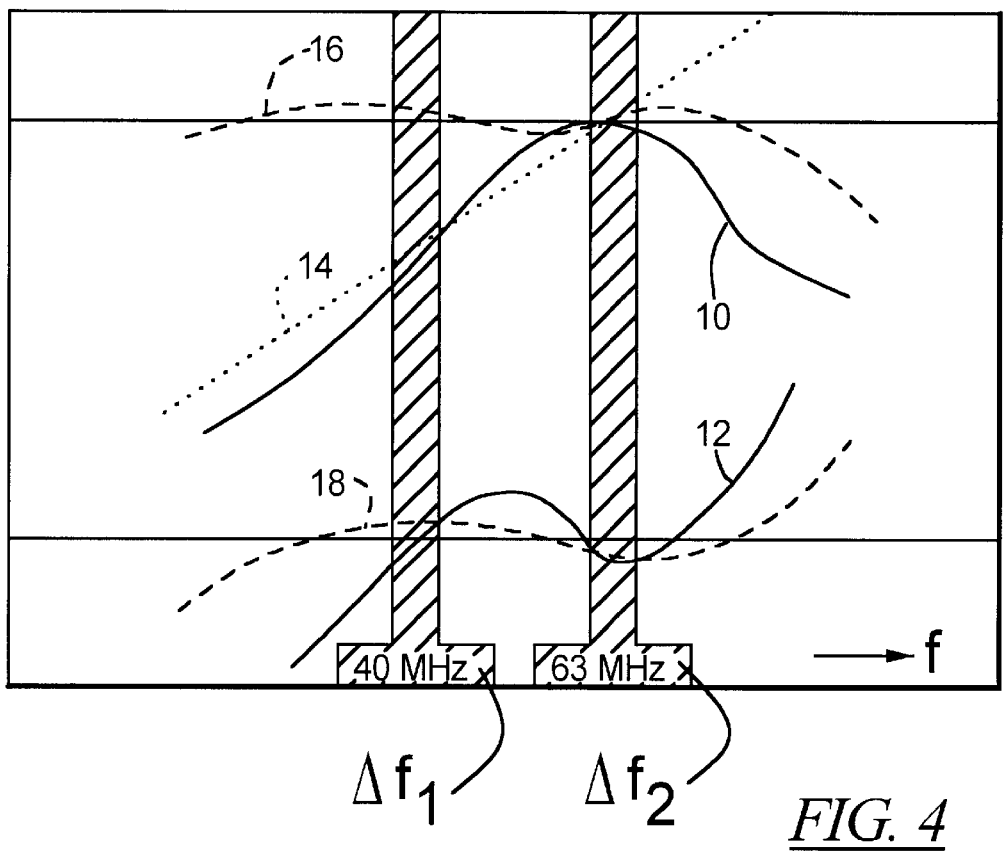
FIG. 4 is a diagram showing the curve of a real and imaginary part of the input admittance of a matching network with an antenna used in he high-frequency amplifier in accordance with the invention.

This relationship shall be explained in greater detail with reference to FIG. 3. FIG. 3 shows the power relationships within the amplifier stage 2. Given a constant operating DC voltage $U_{DC}$, the required DC power $P_{DC}$ increases linearly with the current, i.e. with the high-frequency modulation $U_{HF}$, whereas the high-frequency power that is emitted is quadratically dependent on the degree of modulation corresponding to a characteristic $P_{HF}$. Given 100% modulation (full modulation), the operating DC voltage $U_{DC}$ is across the load as maximally possible voltage (high-frequency peak value). The amplifier stage 2—as already mentioned above—is designed such that a maximum high-frequency pulse power of 15 kW can be output given full modulation. The DC power $P_{DC}$ thereby amounts to approximately 19.1 kW, so that approximately 4.1 kW arise as dissipated power. If the modulation were decreased given unaltered peak guideline $G_L'$, the high-frequency power would correspondingly drop back to a quadratic characteristic $P'_{HF}$. Approximately 5.6 kW dissipated power would then arise given an output high-frequency power of 10 kW; this would have to be correspondingly eliminated. Due to the frequency-dependent lowering of the load guideline value $G_L'$ for the amplifier 2, however, the dissipated power $P_V$ ($f_1$) to be eliminated at 40 MHZ can be clearly reduced. The high-frequency power is then dependent via the characteristic that $P_{HF}'$ of the modulation factor as a result whereof a DC power $P_{DC}$ ($f_1$) of 12.7 kW and, thus, a dissipated power of only 2.7 kW derives at 10 kW high-frequency power because of the lower load guideline value $G_L$ ($f_1$). FIG. 4 shows the fundamental curve of the high-frequency load transformed by the output matching network as input admittance $Y_L$ divided according to real and imaginary part dependent on the frequency. The operating frequency bands $\Delta f_1$ with the center frequency 40 MHZ and $\Delta f_2$ with the center frequency 63 MHZ under consideration are shown with a grey underlay. A normed illustration to a reference guideline value has been selected. The frequency-dependent curve of the real part is identified with reference numeral 10, and the frequency-dependent curve of the imaginary part is identified with reference numeral 12. It can be seen that the ideal curve, namely a continuously proportional rise of the transformed load guideline value represented by a straight line 14, is not achieved given a nearly disappearing imaginary part. On the contrary, it is sufficient that the desired values of the real and imaginary parts are achieved within the individual operating frequency bands $\Delta f_1$ and $\Delta f_2$. The behavior in the remaining frequency ranges is of no consequence for the function and can deviate from the ideal curve, since these frequencies need not be processed by the high-frequency power amplifier. For comparison, the curve of a conventional broadband amplifier is shown in the curves indicated with broken lines. Reference numeral 16 references the related real part and reference numeral 18 references the related imaginary part of a correspondingly dimensioned broadband amplifier.

Figure 5:
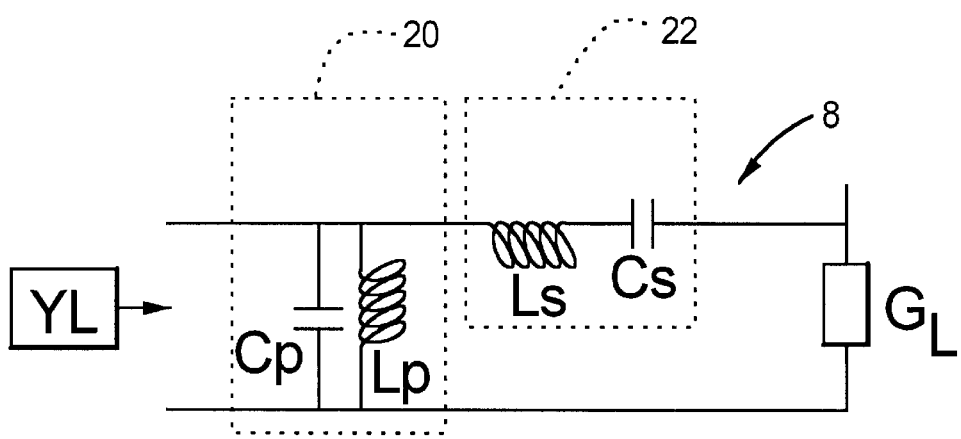
FIG. 5 is a matching network fashioned as a bandpass filter of the second order with an antenna used in the high-frequency amplifier in accordance with the invention.

FIG. 5 shows the basic structure of the output matching network 8. The matching network 8 is composed of a parallel resonant circuit connected in parallel at the input side and of a series resonant circuit 22 connected in series at the output side. The connected high-frequency load should have the same input impedance of $Z_0$=50 Ω at every frequency.

The values of the four components Cs, Ls, Lp and Cp can be determined according to the following method:

Given two frequencies $f_1 < f_2$, the transformation ratios $g_1$ and $g_2$ (g=$G_L \cdot 50$ Ω, g<=1) of the guideline values are selected corresponding to the power prescriptions with $g_2/g_1$=$P_P(f_2)/Pp(f_1)$. The normalized reactances of the series circuit $X_1$=−SQR $(1)/g_1$−1), or $X_2$=SQR $(1/g_2$−1) and the susceptances of the parallel circuit $B_1$=−$g_1 \cdot$SQR $(1/g_1$−1), or $B_2$=$g_2$−SQR $(1/g_2$−1) at $f_1$ and $f_2$ are first calculated therefrom.

From $X_1$ and $X_2$ one obtains
Cs=$(1/(2\pi Z_0)) \cdot ((f_2/f_1 − f_1/f_2)/(f_1 \cdot X_2 − f_2 X_1))$ and
Ls=$(Z_0(2\pi)) \cdot (X_2/f_1 − X_1/f_2)/(f_2/f_1 − f_1/f_2))$;
from $B_1$ and $B_2$
Lp=$(Z_0/(2\pi)) \cdot ((f_2/f_1 − f_1/f_2)/(f_1 B_2 + f_2 B,))$ and
Cp=$(1/(2\pi Z_0)) \cdot ((B_2/f_1 − B_1/f_2)/(f_2/f_1 − f,/f_2))$.

In the aforementioned example, $g_1=0.5$ and $g_2=0.75$ can be selected for 10 kW given $f_1=40.6$ MHZ, or 15 kW given $f_2=63.5$ MHZ. The calculation yields $X_1=-1.0$, $X_2$ 0.577, $B_1=-0.5$, $B_2=0.433$, and thus Cs=33.8 of, Ls=258 mH, Lp=149 nH and Cp=63.9 of.

Figure 6:
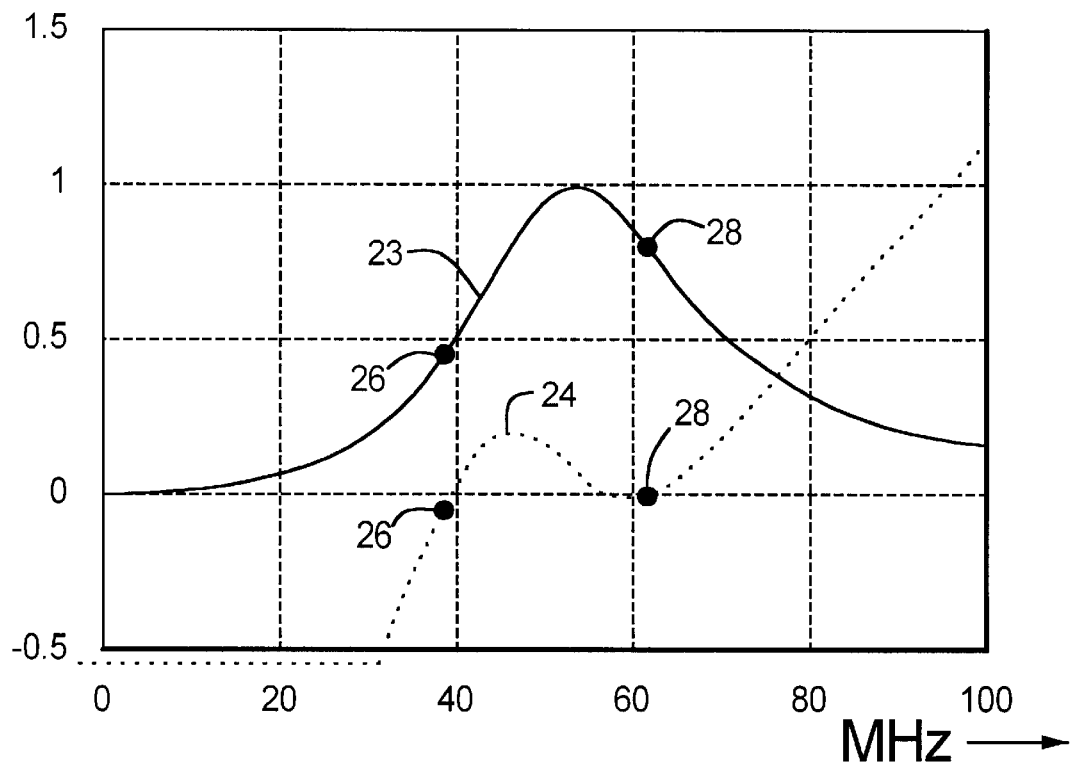
FIG. 6 is a diagram showing the conductive and susceptive part of the normalized input admittance versus frequency of the bandpass filter according to FIG. 5.

The frequency-dependent input guideline values derived from the example are shown separated according to real and imaginary parts in FIG. 6. Curve 22 shows the curve of the real part and curve 24 shows the curve of the imaginary part over the frequency. The operating frequency ranges are marked by points 26 for the lower and points 28 for the higher operating frequency range.

Figure 7:
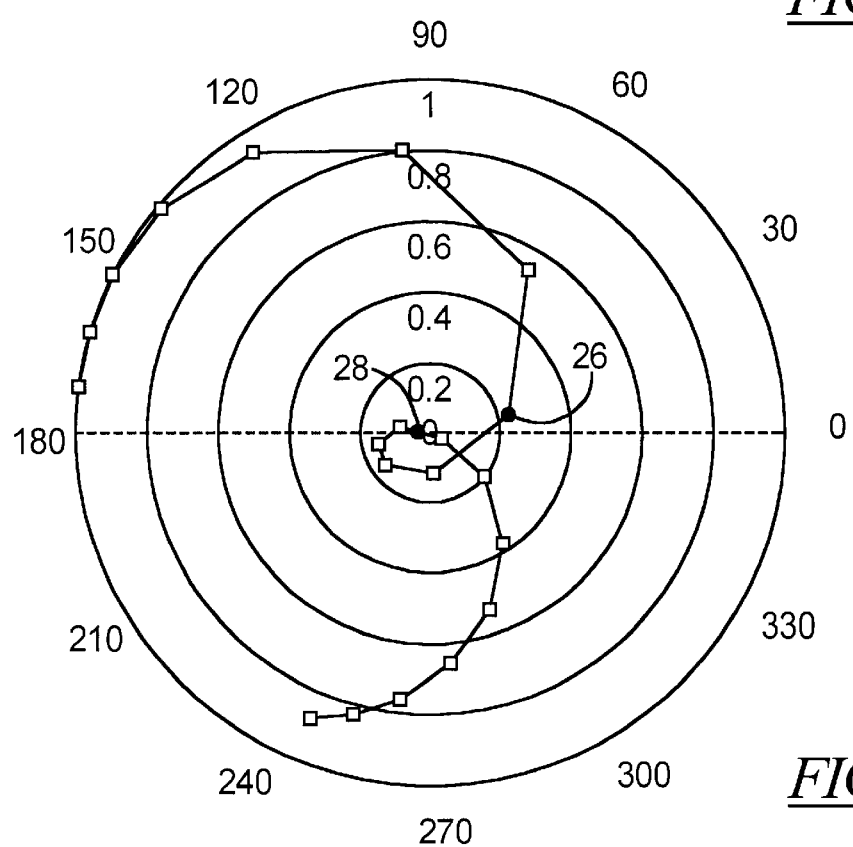
FIG. 7 is a diagram showing the input reflection factor of the bandpass filter according to FIG. 5.

FIG. 7 shows the input reflection factor of the example given a connected high-frequency load in 5 MHZ steps, whereby the reference guideline value was selected at 63.5 MHZ as reference guideline value. Point 26 shows the normalized input reflection factor at 40 MHZ and point 28 shows the normed input reflection factor at 63.5 MHZ.

Figure 8:
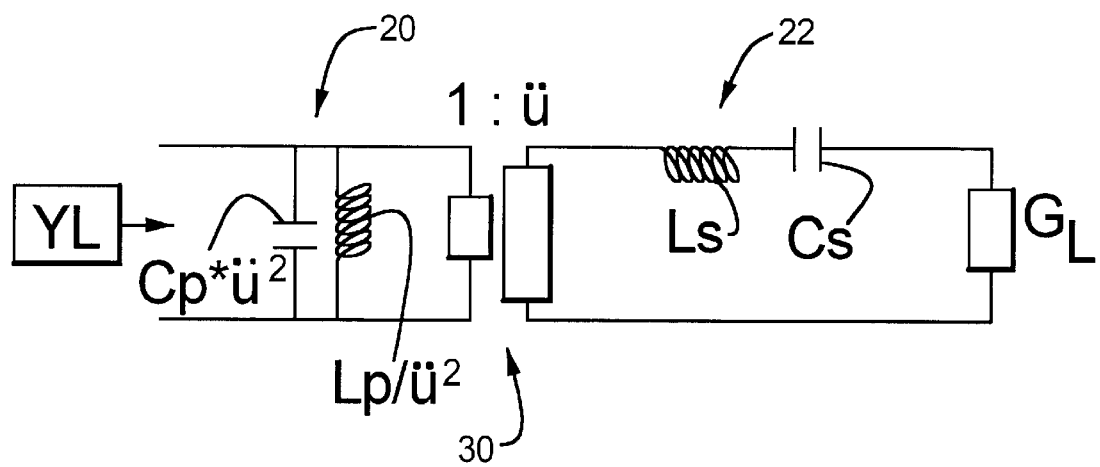
FIG. 8 is a basic circuit of a matching network with a transformer used in the high-frequency amplifier in accordance with the invention.

FIG. 8 shows a version of the output matching network 8 shown in FIG. 5, wherein a magnetically coupled transformer 30 is additionally provided in order to transform the reference impedance $Z_0$ to an arbitrary value adapted to the output power and the selected operating voltage without modification of the relative frequency dependency. The values of the bandpass components must then be scaled according to the turns ratio $\ddot{U}$ of the transformer 30.

Figure 9:
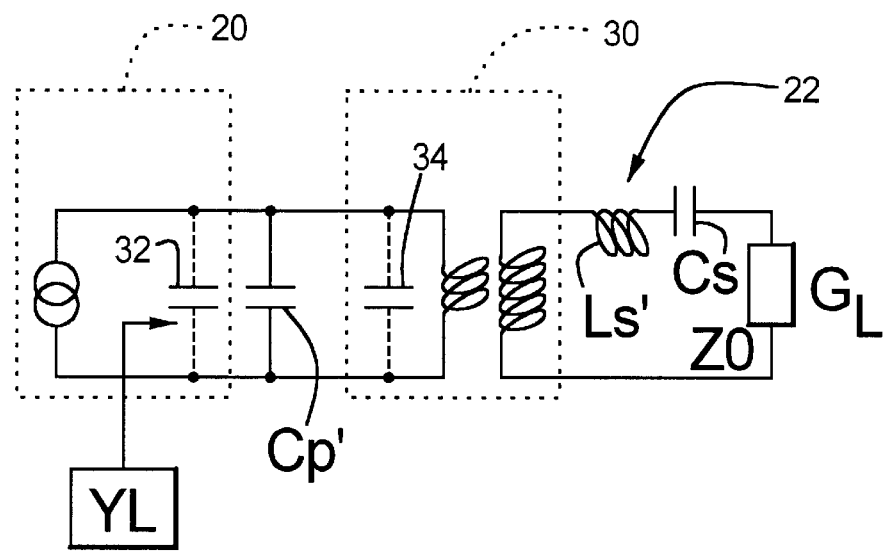
FIG. 9 is a matching network with elements partially formed by parasitic reactances used in the high-frequency amplifier in accordance with the invention.

FIG. 9 shows how parasitic reactances can be included in the transformation elements Cs, Ls, Lp and Cp without difficulties. A modified parallel capacitance Cp' of the parallel resonant circuit 20 then derives by taking the parasitic capacitances 32 of the amplifier stage 2 and the parasitic capacitance 34 of the transformer 30 into consideration, in that these values are subtracted from the parallel resonant circuit capacitance Cp. A modified inductance of the series resonant circuit Ls' derives from the inductance Ls reduced by the stray inductance of the transformer. The parallel inductance Lp of the parallel resonant circuit is here formed only by the main inductance of the transformer 30. With the values of the aforementioned example, a coupling factor of the transformer of k=SUR (Lp/(Lp+Ls))=0.605 suffices, so that an iron-free transformer can be employed. Since such a transformer can be constructed without ferromagnetic material, operation of the amplifier in the magnetic stray field of the nuclear magnetic resonance tomography apparatus is possible.

The capacitance Cs of the series resonant circuit 32 can additionally serve for the separation of DC voltages from the antenna, this being of particular significance in medical apparatus because of the high electrical safety demands.

Although modifications and changes may be suggested by those skilled in the art, it is the intention of the inventors to embody within the patent warranted hereon all changes and modifications as reasonably and properly come within the scope of their contribution to the art.

We claim as our invention:

1. A high-frequency power amplifier for feeding an antenna of a nuclear magnetic resonance tomography apparatus, comprising:

an amplifier stage which has a maximum power output within a first frequency band; and circuitry means connected to said amplifier stage for altering said maximum output power for producing a maximum output power in a second frequency band, said second frequency band being higher than said first frequency band and said maximum output power in said second frequency band being higher than said maximum output power in said first frequency band.

2. A high-frequency power amplifier as claimed in claim 1 further comprising a variable DC voltage source connected to said amplifier stage, said variable DC voltage source supplying a DC voltage to said amplifier stage which is higher given operation of said amplifier stage in said second frequency band than given operation of said amplifier stage in said first frequency band.

3. A high-frequency power amplifier as claimed in claim 1 wherein said amplifier stage has an output and wherein said antenna has an admittance, and wherein said power amplifier further comprises an output matching network connected to said output of said amplifier stage for transforming said admittance of said antenna into a high-frequency load admittance for said amplifier stage which is higher in said second frequency band than in said first frequency band.

4. A high-frequency power amplifier as claimed in claim 3 wherein said matching network comprises a bandpass filter.

5. A high-frequency power amplifier as claimed in claim 4 wherein said matching network comprises a bandpass filter of the second order having an input side and an output side, and comprising a parallel resonant circuit connected in parallel across said input side and a series resonant circuit connected in series at said output side.

6. A high-frequency power amplifier as claimed in claim 5 wherein said amplifier stage comprises an output capacitance, and wherein said parallel resonant circuit includes a parallel resonant circuit capacitance, and wherein said output capacitance of said amplifier stage forms at least a portion of said parallel resonant circuit capacitance.

7. A high-frequency power amplifier as claimed in claim 5 wherein said matching network comprises a magnetically coupled transformer.

8. A high-frequency power amplifier as claimed in claim 7 wherein said magnetically coupled transformer has a primary inductance, a stray inductance, and a parasitic capacitance, and wherein said matching network has a parallel resonant circuit inductance, a parallel resonant circuit capacitance, and a series resonant circuit inductance, and wherein said primary inductance of said magnetically coupled transformer forms at least a portion of said parallel resonant circuit inductance, said parasitic capacitance of said magnetically coupled transformer forms at least a portion of said parallel resonant circuit capacitance, and said stray inductance of said magnetically coupled transformer forms at least a portion of said series resonant circuit inductance.

9. A high-frequency power amplifier as claimed in claim 7 wherein said magnetically coupled transformer is free of ferromagnetic material.

* * * * *